United States Patent
Miyamura et al.

(10) Patent No.: US 6,977,709 B2
(45) Date of Patent: Dec. 20, 2005

(54) FLAT DISPLAY APPARATUS

(75) Inventors: Yukiharu Miyamura, Shizuoka-ken (JP); Koichi Kaneko, Shizuoka-ken (JP); Sadao Yokoi, Shizuoka-ken (JP); Yousuke Tagaya, Shizuoka-ken (JP); Toshiharu Oishi, Shizuoka-ken (JP)

(73) Assignee: Pioneer Corporation, Tokyo (JP)

( * ) Notice: Subject to any disclaimer, the term of this patent is extended or adjusted under 35 U.S.C. 154(b) by 233 days.

(21) Appl. No.: 10/724,120

(22) Filed: Dec. 1, 2003

(65) Prior Publication Data

US 2004/0114063 A1    Jun. 17, 2004

(30) Foreign Application Priority Data

Dec. 13, 2002  (JP) .............................. 2002-362787

(51) Int. Cl.⁷ .......................................... G02F 1/1333
(52) U.S. Cl. ..................... 349/158; 349/58; 349/149
(58) Field of Search .......................... 349/158, 58, 149, 349/150

(56) References Cited

U.S. PATENT DOCUMENTS

| | | | |
|---|---|---|---|
| 4,851,613 A | 7/1989 | Jacques | 174/68.5 |
| 5,442,470 A | 8/1995 | Hashimoto | 359/83 |
| 5,748,269 A * | 5/1998 | Harris et al. | 349/58 |
| 5,841,414 A | 11/1998 | Tanaka | 345/87 |
| 6,512,557 B1 * | 1/2003 | Miwa | 349/58 |
| 6,587,166 B1 * | 7/2003 | Lee et al. | 349/58 |
| 6,636,281 B1 * | 10/2003 | Kanatsu | 349/58 |
| 2002/0186551 A1 | 12/2002 | Murowaki et al. | 361/752 |

FOREIGN PATENT DOCUMENTS

| | | |
|---|---|---|
| EP | 0 632 685 A2 | 1/1995 |
| EP | 1 081 531 A2 | 3/2001 |
| JP | 2000-56701 | 2/2000 |
| JP | 2003-243778 | 8/2003 |

* cited by examiner

*Primary Examiner*—Dung T. Nguyen
*Assistant Examiner*—David Chung
(74) *Attorney, Agent, or Firm*—Arent Fox PLLC

(57) ABSTRACT

A drive circuit board 11 is mounted on a side portion of a chassis 10 in a position forming an angle with a flat display panel 1. A wiring board 13 has two flections 13DA, 13DB formed in two positions. The wiring board 13 is placed in a front corner of the flat display apparatus and between the flat display panel 1 and the drive circuit board 11, which are placed at angles on the chassis 10, in such a way that electrode terminals 13B and 13C are respectively connected to the flat display panel 1 and the drive circuit board 11, and a board body 13A is bent by the flections 13DA, 13DB, provided in the two positions, in the direction of projecting toward the front of the flat display panel 1.

9 Claims, 7 Drawing Sheets

FLAT DISPLAY APPARATUS

BACKGROUND OF THE INVENTION

1. Field of the Invention

This invention relates to the structure of flat display apparatuses.

The present application claims priority from Japanese Application No. 2002-362787, the disclosure of which is incorporated herein by reference.

2. Description of the Related Art

In recent years, slim and flat display apparatuses have become increasingly widespread as a display apparatus having a flat display panel, such as a plasma display panel (referred to as "PDP"), field emission display panel (referred to as "FED"), inorganic or organic EL display panel, liquid crystal display panel (referred to as "LCD"), and the like.

FIG. 1 is a sectional view illustrating a structure for supporting a drive circuit board provided for driving a flat display panel of a conventional flat display apparatus for generation of an image.

In FIG. 1, the flat display apparatus has a flat display panel 1 supported by a chassis 2, and a drive circuit board 3 mounted on the rear face of the chassis 2 and supported parallel to the flat display panel 1.

The drive circuit board 3 is connected to the flat display panel 1 by a wiring board (e.g. TCP: Tape Carrier Package) 4 curving around a side of the chassis 2.

As illustrated in FIG. 2, the wiring board 4 has a driver integrated circuit 4B fixed in a substantially central portion of a plate-shaped board body 4A, an electrode terminal 4C formed in one edge (the lower edge in FIG. 2) of the board body 4A and connected to the flat display panel 1, and an electrode terminal 4D formed in the other edge (the upper edge in FIG. 2) and connected to the drive circuit board 3.

The wiring board 4 further has a flection 4E extending in a portion parallel to the electrode terminal 4C between the driver integrated circuit 4B and the electrode terminal 4C on the board body 4A. The flection 4E enables the bending of the board body 4A. Further a flection 4F extends in parallel to the electrode terminal 4D in a portion between the driver integrated circuit 4B and the electrode terminal 4D.

The wiring board 4 is placed in front of the lateral end of the chassis 2 in a position approximately right angles to the flat display panel. The wiring board 4 is then bent at the flections 4E so that the electrode terminal 4C becomes parallel to the flat display panel 1. Then the electrode terminal 4C is connected to an electrode terminal of the flat display panel 1 by means of thermo-compression bonding. The wiring board 4 is also bent at the flections 4F so that the electrode terminal 4D becomes parallel to the drive circuit board 3. Then the electrode terminal 4D is connected to an electrode terminal of the drive circuit board 3 by means of thermo-compression bonding.

Such the foregoing conventional flat display apparatuses is showed in JP Pat. Publication No. 2000-56701.

In the foregoing conventional flat display apparatus, the flat display panel 1 and the drive circuit board 3 are arranged in parallel to each other with the chassis 2 in between. The wiring board 4 is placed in front of the lateral end of the chassis 2 in a position approximately at right angles to the flat display panel 1 so as to straddle the chassis 2 for establishing a connection between the flat display panel 1 and the drive circuit board 3. With this structure, the thickness of the chassis 2 causes an increase not only in the space between the flat display panel 1 and the drive circuit board 3, but also in the length of the wiring board 4, making unnecessary the use of an expensive wiring board 4. The use of an expensive wiring board is a factor in the increase of the production costs.

SUMMARY OF THE INVENTION

The present invention has been made to solve the problem associated with the conventional flat display apparatus as described above.

Therefore, it is an object of the present invention to provide a flat display apparatus capable of lowering costs.

To attain the above object, the present invention provides a flat display apparatus including: a flat display panel; a chassis member for supporting the flat display panel from the rear; a drive circuit board provided for the flat display panel; and a wiring member having a first electrode terminal connected to the flat display panel, and a second electrode terminal connected to the drive circuit board, to establish a connection between the flat display panel and the drive circuit board. The flat display apparatus has the advantages of: placing the drive circuit board in a side portion of the chassis member at an angle to the flat display panel, and forming bendable portions in a plurality of positions of the wiring member to enable free bending of the wiring member, in which the wiring member is mounted in a front corner of the flat display apparatus and between the flat display panel and the drive circuit board which are mounted at an angle to each other on the chassis member, in such a way that the first electrode terminal and the second electrode terminal are respectively connected to the flat display panel and the drive circuit board, and a portion of the wiring member between the first electrode terminal and the second electrode terminal is bent in a direction of projecting toward the front of the flat display panel by use of the bendable portions formed in the plurality of positions.

The flat display apparatus according to the present invention concept includes a chassis member for supporting a flat display panel such as a PDP, FED, liquid crystal panel or the like. A drive circuit board for driving the flat display panel and controlling the driving is mounted on the chassis in a direction of forming an angle with respect to the flat display panel, namely, in a direction at right angles or an oblique angle to the flat display panel.

In the front side corner of the flat display apparatus and between the flat display panel and the drive circuit board which are placed at angles to each other, a wiring board having a driver integrated circuit or a wiring member such as a flexible cable is mounted so as to connect the first electrode terminal to the flat display panel and the second electrode terminal to the drive circuit board for forming the connection between the flat display panel and the drive circuit board.

Here, the wiring member is bent by use of bendable portions formed in a plurality of positions of the wiring member such that part of the member body between the first electrode terminal and the second electrode terminal projects in the direction of the front of the flat display panel.

With the flat display apparatus according to the present invention, the drive wiring board is supported by the chassis member in a position forming an angle with the flat display panel, and the wiring member establishes the connection between the drive wiring board and the flat display panel in the front side corner of the flat display apparatus. This structure enables the connection of the flat display panel and the drive circuit board over the shortest possible distance, thereby decreasing the length of the wiring member as compared with a conventional wiring member. As a result it is possible to reduce the parts cost of an expensive wiring member to lower production costs.

Further, with the flat display apparatus according to the present invention, by bending the wiring member in the direction of projecting toward the front side of the flat display panel by means of its bendable portions formed in a plurality of positions, the connection of the flat display panel and the drive circuit board is established in the form of making an allowance. Due to this allowance, even when, for example, the positional relationship between the flat display panel and the drive circuit board is changed by deformation, displacement or the like of the chassis, the wiring board is prevented from being damaged and the electrode terminals maintain their connection. Accordingly, it is possible to improve the reliability of production quality.

These and other objects and features of the present invention will become more apparent from the following detailed description with reference to the accompanying drawings.

DETAILED DESCRIPTION OF THE PREFERRED EMBODIMENTS

Preferred embodiments according to the present invention will be described below in detail with reference to the accompanying drawings.

Figure 1:
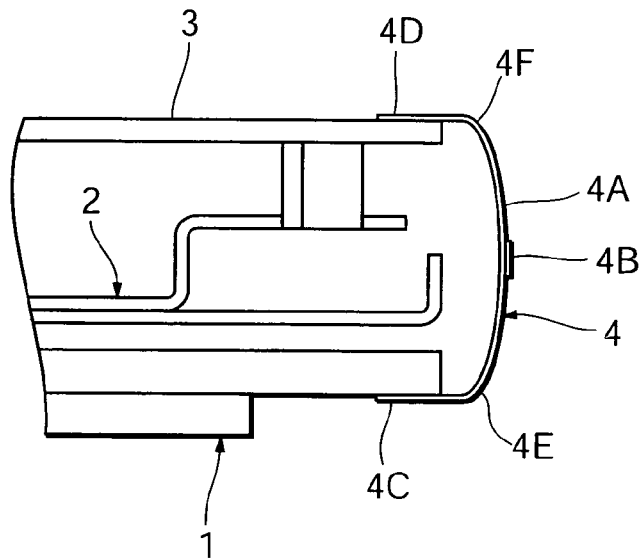
FIG. 1 is a plane cross section view illustrating the structure of a conventional flat display apparatus.
Figure 2:
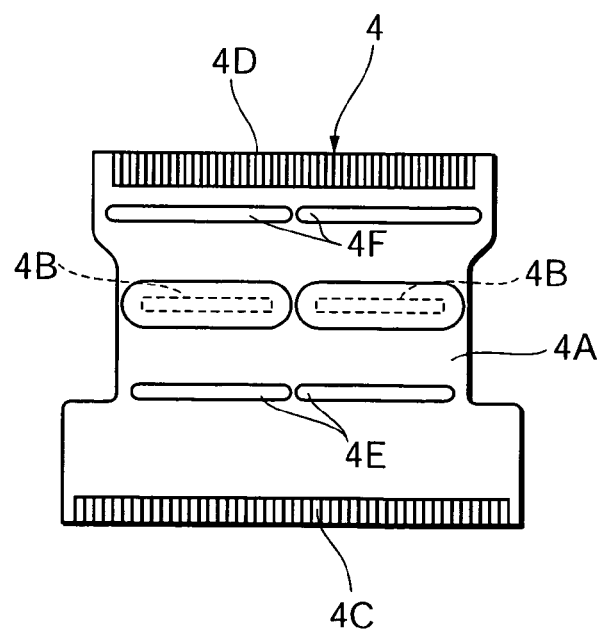
FIG. 2 is a plan view illustrating the configuration of a conventional wiring board.
Figure 3:
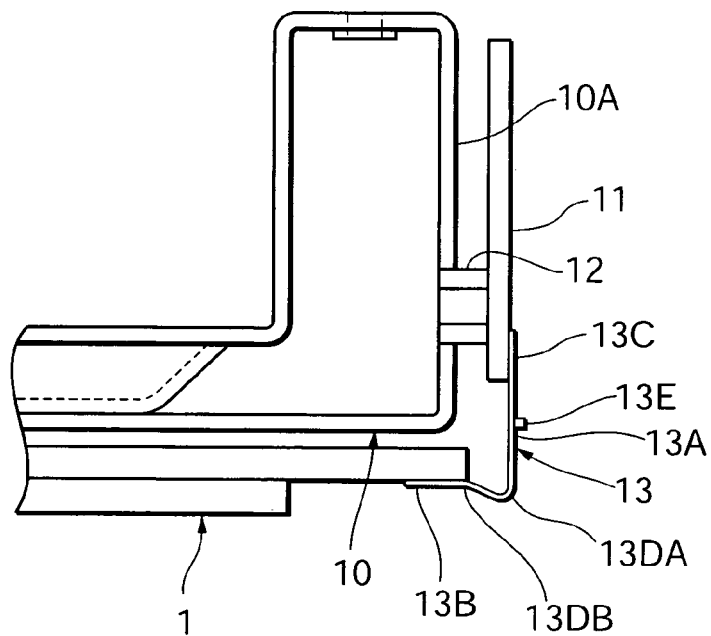
FIG. 3 is a plane cross sectional view illustrating a first embodiment of a flat display apparatus according to the present invention.

FIG. 3 is a plane cross sectional view illustrating the structure of one lateral end of a flat display apparatus according to a first embodiment of the present invention.

In FIG. 3, a chassis 10 supports a flat display panel 1 and has an outer face 10A of a lateral end formed in a plane shape extending in a direction at right angles to the flat display panel 1.

A drive circuit board 11 is mounted on the outer face 10A of the chassis 10 by the interposition of a mounting fixture 12, and positioned parallel to the outer face 10A, namely, at right angles to the flat display panel 1.

The drive circuit board 11 mounted on the outer face 10A of the chassis 10 is connected through a wiring board 13 to the flat display panel 1 supported on the front surface of the chassis 10.

Figure 4:
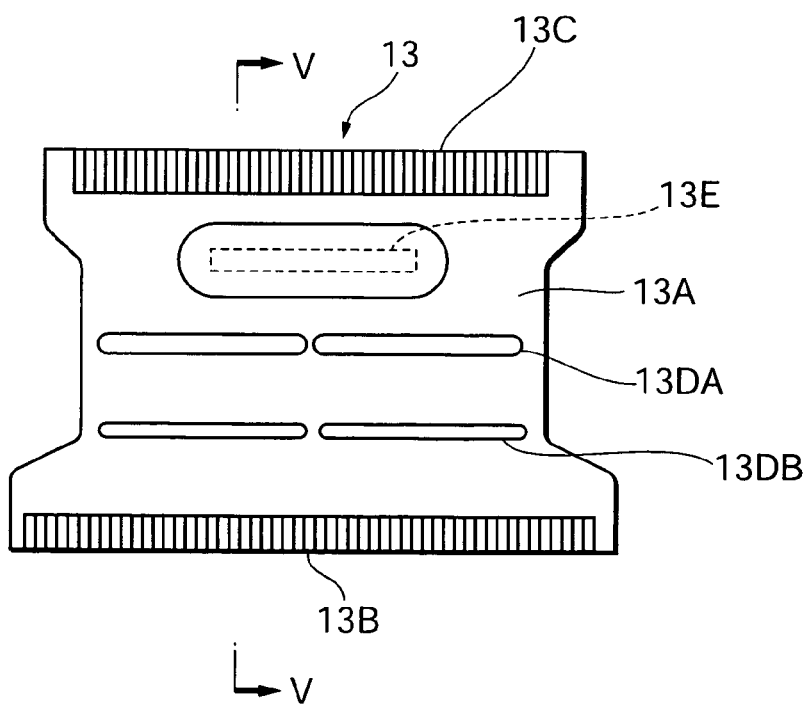
FIG. 4 is a plan view illustrating the configuration of a wiring board in the first embodiment.

The wiring board 13, as illustrated in FIG. 4, has an electrode terminal 13B formed in one edge (the lower edge in FIG. 4) of a plate-shaped board body 13A and connected to the flat display panel 1, and an electrode terminal 13C formed in the other edge (the upper edge in FIG. 4) and connected to the drive circuit board 11.

Further, in the board body 13A of the wiring board 13, a flection 13DA enabling the bending of the board body 13A is formed in an approximately central portion of the board body 13A and extends in the width direction of the board body 13A (in the right-left direction in FIG. 4). A flection 13DB is also formed parallel to the flection 13DA in the portion of the board body 13A on the electrode terminal 13B side with respect to the flection 13DA.

A driver integrated circuit 13E is seated in the portion of the board body 13A between the flection 13DA and the electrode terminal 13C.

Figure 5:
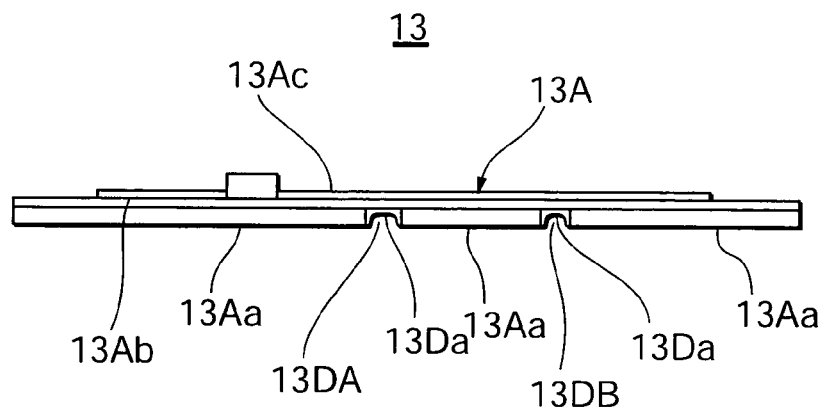
FIG. 5 is a sectional view taken along the V—V line in FIG. 4.

FIG. 5 is a sectional view taken along the line V—V line on the wiring board 13 in FIG. 4.

In FIG. 5, the board body 13A of the wiring board 13 is constituted of an insulation resin plate (polyimide tape in the first embodiment) 13Aa, a wiring pattern 13Ab of a copper wire formed on the insulation resin plate 13Aa, and an insulating layer 13Ac covering the wiring pattern 13Ab.

For the formation of each of the flections 13DA and 13DB of the wiring board 13, the part of the insulation resin plate 13Aa corresponding to the flection is removed in a strip shape, and then a thin coat of another insulation resin 13Da is applied to the exposed part.

In the front corner of the flat display apparatus (the bottom right-hand corner in FIG. 3), one electrode terminal 13B of the wiring board 13 is connected to the electrode terminal of the flat display panel 1 by means of thermo-compression bonding, and the other electrode terminal 13C is connected to the electrode terminal of the drive circuit board 11 by means of thermo-compression bonding, whereby the wiring board 13 establishes a connection between the flat display panel 1 and the drive circuit board 11.

At this point, the board body 13A of the wiring board 13 is bent toward the front of the flat display panel 1 in the flection 13DB situated close to the electrode terminal 13B. Further, the board body 13A is again bent, in the flection 13DA situated approximately in the central portion of the board body 13A, in the direction of the rear of the flat display panel 1 to become parallel to the drive circuit board 11.

The following explains why the wiring board 13 is mounted between the flat display panel 1 and the drive circuit board 11 which are positioned at right angles to each other, thus making the approximately central portion of the board body 13A project toward the front of the flat display panel 1.

Figure 6:
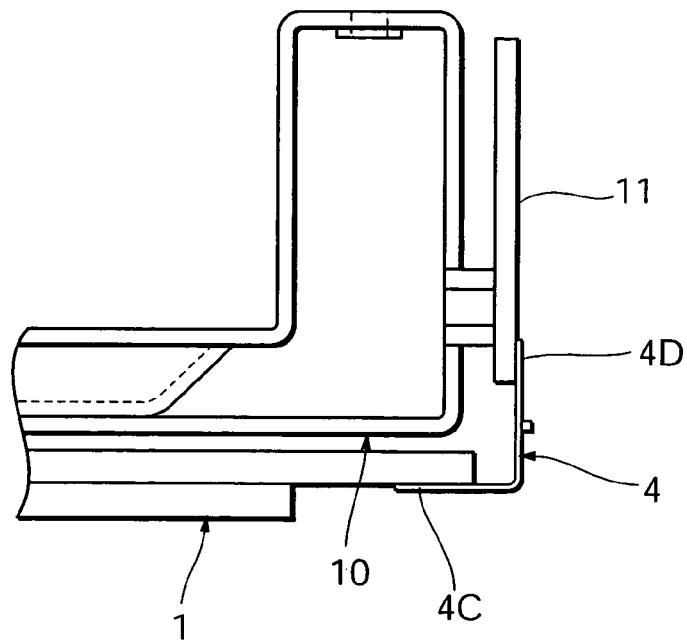
FIG. 6 is a plane cross sectional view illustrating an example of the form of connection of the wiring board of the flat display apparatus.
Figure 7:
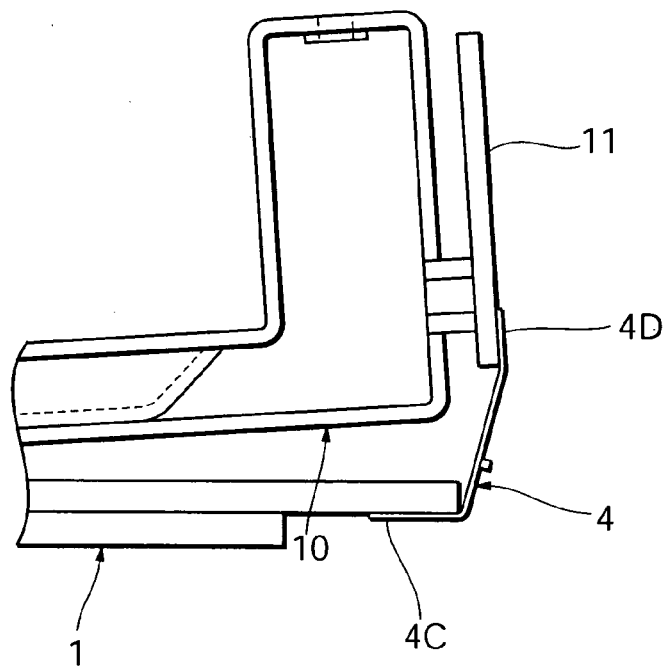
FIG. 7 is a diagram for illustrating a problem in the form of connection of the wiring board in FIG. 6.

In the case where a conventional formation of bending the wiring board 4 at approximately right angles as illustrated in FIG. 6 is adopted for the connection between the flat display panel 1 and the drive circuit board 11 which are positioned at right angles to each other, it is possible, as illustrated in FIG. 7, for the chassis 10 to be inclined toward the flat display panel 1 during the manufacturing process or by deformation of the chassis 10 caused by warping, deflection and the like, thus opening up a space between the side end of the flat display panel 1 and the side end of the chassis 10. In such a event, there is a likelihood that the portion of the board body 4A around the electrode terminal 4C connected to the flat display panel 1 may be bent and fractured.

Figure 8:
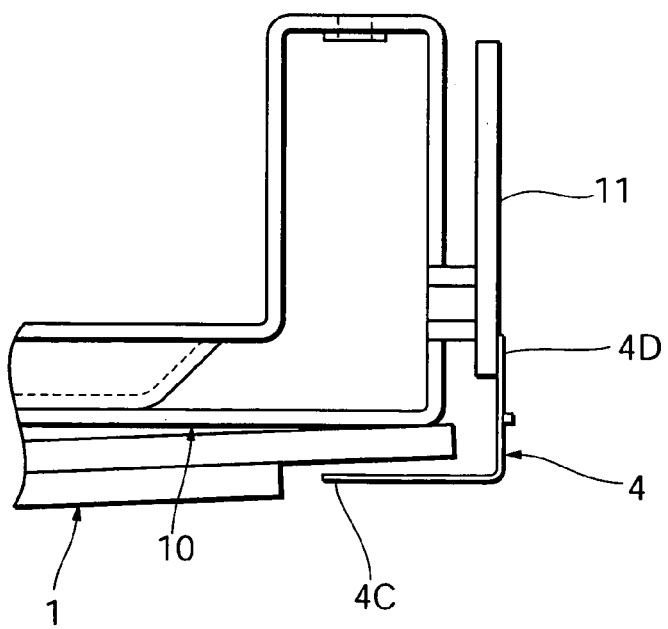
FIG. 8 is a diagram for illustrating another problem in the form of connection of the wiring board in FIG. 6.

On the other hand, as illustrated in FIG. 8, if the chassis 10 is inclined in the opposite direction to the direction of inclining in FIG. 7 with respect to the flat display panel 1 to lessen the space between the side end of the flat display panel 1 and the side end of the chassis 10, in that event, there is a likelihood that the electrode terminal 4C of the wiring board 4 may be disconnected from the electrode terminal of the flat display panel 1.

Figure 9:
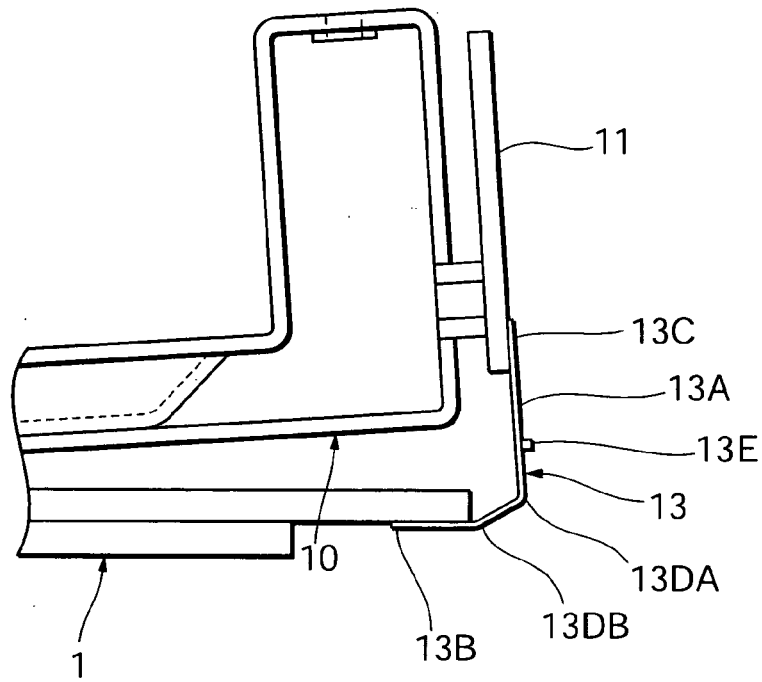
FIG. 9 is a diagram for illustrating an effect of the form of connection of the wiring board of the flat display apparatus according to the present invention.

However, as described earlier, the wiring board 13 is mounted in such a way that the approximately central portion of the wiring board 13 projects toward the front side of the flat display panel 1 as illustrated in FIG. 3. Due to this way of mounting, even when the chassis 10 is inclined with respect to the flat display panel 1 during the manufacturing process or by deformation of the chassis 10 caused by warping, deflection and the like, thus opening up a space between the side end of the flat display panel 1 and the side end of the chassis 10 as in the case of the illustration in FIG. 7, damage to the portion of the board body 13 around the electrode terminal 13B is avoided because of the allowance created by bending the approximately central portion of the wiring board 13 to project in the direction of the front side of the flat display panel 1, as illustrated in FIG. 9.

Figure 10:
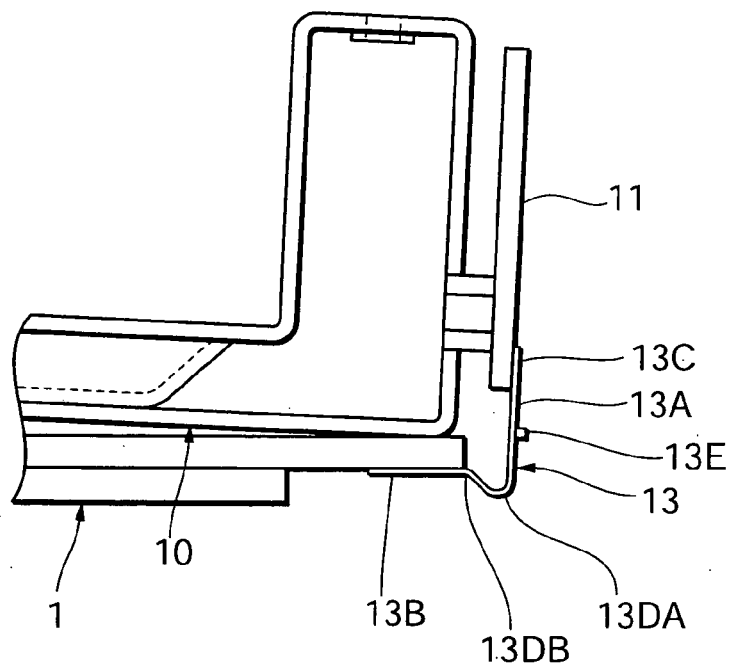
FIG. 10 is a diagram for illustrating another effect of the form of connection of the wiring board of the flat display apparatus according to the present invention.

Further, even when the chassis 10 is inclined in the opposite direction with respect to the flat display panel 1, lessening the space between the side end of the flat display panel 1 and the side end of the chassis as in the case of the illustration in FIG. 8, disconnection of the electrode terminal 13B of the wiring board 13 from the electrode terminal of the flat display panel 1 is avoided because the flection 13DB formed close to the electrode terminal 13B enables the free bending of the board body 13A, as illustrated in FIG. 10.

As described hitherto, with the flat display apparatus in the first embodiment, the flat display panel 1 and the drive circuit board 11 are able to be connected over the shortest possible distance, so that it is possible to decrease the length of the wiring board 13 as compared with a conventional wiring board to reduce the parts cost of the expensive wiring board 13 for lowering production costs.

Further, even when the positional relationship between the flat display panel 1 and the drive circuit board 11 is changed by deformation, displacement or the like of the chassis 10, the wiring board 13 is prevented from being damaged and the electrode terminals maintain their connection. Accordingly, it is possible to improve the reliability of production quality FIG. 11 is a plane cross sectional view illustrating the structure of one lateral end portion of a flat display apparatus in a second embodiment according to the present invention.

Figure 11:
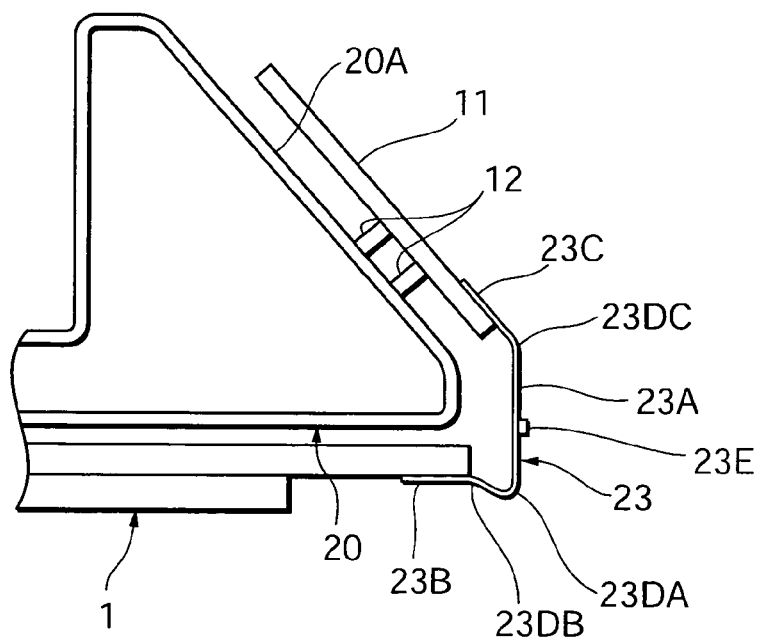
FIG. 11 is a plane cross-section view illustrating a second embodiment of the flat display apparatus according to the present invention.

In FIG. 11, a drive circuit board 11 is mounted on an outer face 20A of a chassis 20 supporting a flat display panel 1. The outer face 20A is inclined steadily inward (the left-hand direction in FIG. 11) with respect to the flat display panel 1 as it extends in the direction of the rear of the flat display panel 1 (the upper direction in FIG. 11).

The wiring board 23 is supported by the mounting fixtures 12 so as to be in parallel to the outer face 20A of a side end of the chassis 20, namely, so as to be inclined in the same direction as that of the outer face 20A with respect to the flat display panel 1.

The drive circuit board 11 mounted on the outer face 20A of the chassis 20 and the flat display panel 1 supported on the front face of the chassis 20 are connected to each other by a wiring board 23.

Figure 12:
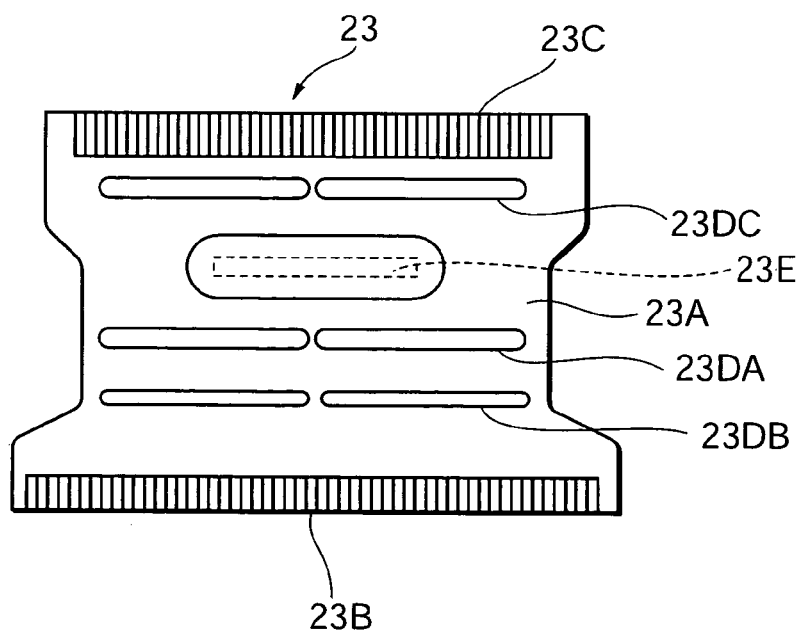
FIG. 12 is a plan view illustrating the configuration of a wiring board in the second embodiment.

As illustrated in FIG. 12, the wiring board 23 has an electrode terminal 23B formed at one edge (the lower edge in FIG. 12) of a plate-shaped board body 23A, and an electrode terminal 23C formed at the other edge (the upper edge in FIG. 12). The electrode terminal 23B is connected to the flat display panel 1, and the electrode terminal 23C to the drive circuit board 11.

Further, in the board body 23A of the wiring board 23, a flection 23DA enabling the bending of the board body 23A is formed in an approximately central portion of the board body 23A and extends in the width direction of the board body 23A (in the right-left direction in FIG. 12). A flection 23DB is also formed parallel to the flection 23DA in a portion of the board body 23A on the electrode terminal 23B side with respect to the flection 23DA. Further, a flection 23DC is formed in parallel to the flection 23DA in a portion of the board body 23A on the electrode terminal 23C side with respect to the flection 23DA.

A driver integrated circuit 23E is seated in a portion of the board body 23A between the flection 23DA and the electrode terminal 23C.

The method of forming the flections 23DA, 23DB and 23DC is similar to the method described in FIG. 5 in the first embodiment.

In the front corner of the flat display apparatus (the bottom right-hand corner in FIG. 11), one electrode terminal 23B of the wiring board 23 is connected to the electrode terminal of the flat display panel 1 by means of thermo-compression bonding, and the other electrode terminal 23C is connected to the electrode terminal of the drive circuit board 11 by means of thermo-compression bonding, whereby the wiring board 23 establishes a connection between the flat display panel 1 and the drive circuit board 11.

Here, the board body 23A of the wiring board 23 is bent toward the front of the flat display panel 1 in the flection 23DB situated close to the electrode terminal 23B, then bent approximately at right angles toward the rear of the flat display panel 1 in the flection 23DA situated approximately in the central portion of the board body 23A, and then bent toward the inside (toward the chassis 20) in the flection 23DC.

As in the case of the first embodiment, the flat display apparatus in the second embodiment is capable of connecting the flat display panel 1 and the drive circuit board 11 over the shortest possible distance. Therefore, it is possible to decrease the length of the wiring board 23 as compared with a conventional wiring board to reduce the parts cost of the expensive wiring board 23 for achieving low cost.

Further, even when the positional relationship between the flat display panel 1 and the drive circuit board 11 is changed by deformation, displacement or the like of the chassis 20, the wiring board 23 is prevented from being damaged and the electrode terminals maintain their connection. Accordingly, it is possible to improve the reliability of production quality.

Figure 13:
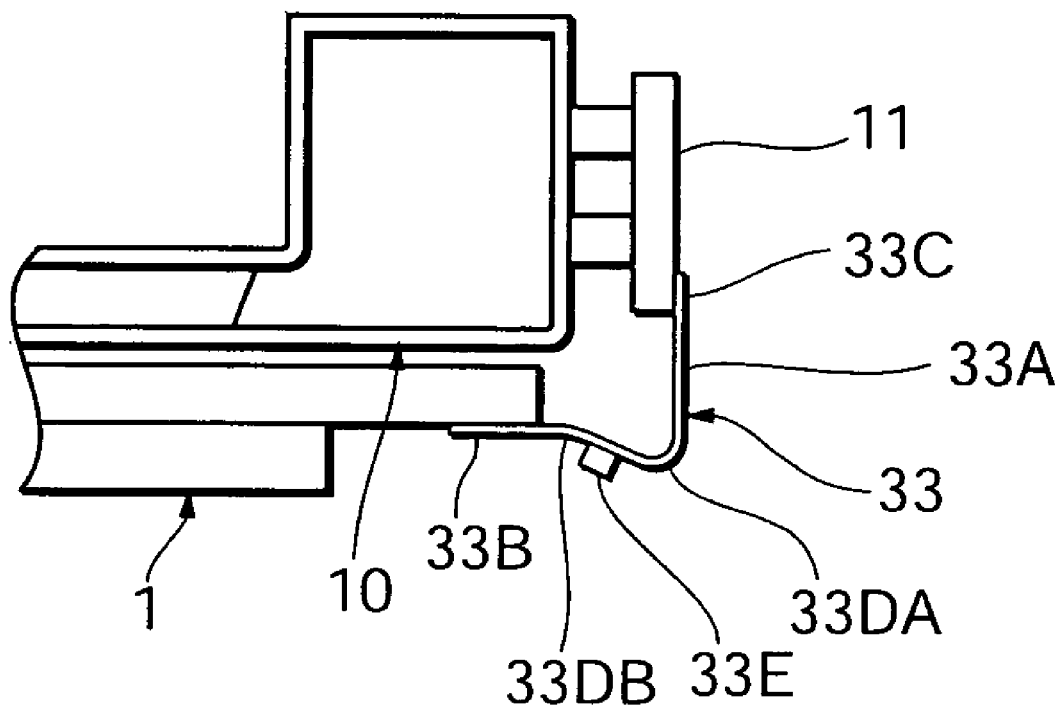
FIG. 13 is a plane cross-section view illustrating a third embodiment of the flat display apparatus according to the present invention.

FIG. 13 is a plane cross sectional view illustrating the structure of one lateral end portion of a flat display apparatus in a third embodiment according to the present invention.

In FIG. 13, a drive circuit board 11 is placed in a position approximately at right angles to the flat display panel 1 as in the case of the first embodiment described in FIG. 3, and connected through a wiring board 33 to the flat display panel 1.

At this point, a board body 33A of the wiring board 33 is bent toward the front of the flat display panel 1 in a flection 33DB situated close to an electrode terminal 33B, and then bent, in a flection 33DA situated approximately in the central portion of the board body 33A, toward the rear of the flat display panel 1 to become parallel to the drive circuit board 11, in order to establish a connection between the flat display panel 1 and the drive circuit board 11 as in the case of the first embodiment described in FIG. 3. A point of difference from the case of the first embodiment is that a drive integrated circuit 33E is installed in a portion between the flax portions 33DA and 33DB of the board body 33A.

A generic concept of the flat display apparatus in the foregoing embodiments is a flat display apparatus including: a flat display panel; a chassis member for supporting the flat display panel from the rear; a drive circuit board provided for the flat display panel; and a wiring member having a first electrode terminal connected to the flat display panel, and a second electrode terminal connected to the drive circuit board, to establish a connection between the flat display panel and the drive circuit board. Further, the drive circuit board is placed in a side portion of the chassis member at an angle to the flat display panel. The wiring member further has bendable portions formed in a plurality of positions of the wiring member to enable free bending of the wiring member. The wiring member is mounted in a front corner of the flat display apparatus and between the flat display panel and the drive circuit board which are mounted at an angle to each other on the chassis member, in such a way that the first electrode terminal and the second electrode terminal are respectively connected to the flat display panel and the drive circuit board, and a portion of the wiring member between the first electrode terminal and the second electrode terminal is bent in a direction of projecting toward the front of the flat display panel by use of the bendable portions formed in the plurality of positions.

The flat display apparatus of an embodiment forming the generic concept includes a chassis member for supporting a flat display panel such as a PDP, FED, liquid crystal panel or the like. A drive circuit board for driving the flat display panel and controlling the driving is mounted on the chassis in a direction of forming an angle with respect to the flat display panel, namely, in a direction at right angles or an oblique angle to the flat display panel.

In the front side corner of the flat display apparatus and between the flat display panel and the drive circuit board which are placed at angles to each other, a wiring board having a driver integrated circuit or a wiring member such as a flexible cable is mounted so as to connect the first electrode terminal to the flat display panel and the second electrode terminal to the drive circuit board for forming the connection between the flat display panel and the drive circuit board.

Here, the wiring member is bent by use of bendable portions formed in a plurality of positions of the wiring member such that part of the member body between the first electrode terminal and the second electrode terminal projects in the direction of the front of the flat display panel.

With the flat display apparatus embodying the generic concept, the drive wiring board is supported by the chassis member in a position forming an angle with the flat display panel, and the wiring member establishes the connection between the drive wiring board and the flat display panel in the front side corner of the flat display apparatus. This structure enables the connection of the flat display panel and the drive circuit board over the shortest possible distance, thereby decreasing the length of the wiring member as compared with a conventional wiring member. As a result it is possible to reduce the parts cost of an expensive wiring member to lower production costs.

Further, with the flat display apparatus embodying the generic concept, by bending the wiring member in the direction of projecting toward the front side of the flat display panel by means of its bendable portions formed in a plurality of positions, the connection of the flat display panel and the drive circuit board is established in the form of making an allowance. Due to this allowance, even when, for example, the positional relationship between the flat display panel and the drive circuit board is changed by deformation, displacement or the like of the chassis, the wiring board is prevented from being damaged and the electrode terminals maintain their connection. Accordingly, it is possible to improve there liability of production quality.

The terms and description used herein are set forth by way of illustration only and are not meant as limitations. Those skilled in the art will recognize that numerous variations are possible within the spirit and scope of the invention as defined in the following claims.

What is claimed is:

1. A flat display apparatus comprising:
   a flat display panel;
   a chassis member for supporting the flat display panel from the rear of the flat display panel;
   a drive circuit board provided for the flat display panel; and
   a wiring member having a first electrode terminal connected to the flat display panel, and a second electrode terminal connected to the drive circuit board, to establish a connection between the flat display panel and the drive circuit board,
   wherein the drive circuit board is placed in a side portion of the chassis member at an angle to the flat display panel;
   wherein the wiring member has bendable portions formed in a plurality of positions of the wiring member to enable free bending of the wiring member; and
   wherein the wiring member is mounted in a front corner of the flat display apparatus and between the flat display panel and the drive circuit board which are mounted at an angle to each other on the chassis member, in such away that the first electrode terminal and the second electrode terminal are respectively connected to the flat display panel and the drive circuit board, and a portion of the wiring member between the first electrode terminal and the second electrode terminal is bent in a direction of projecting toward the front of the flat display panel by use of the bendable portions formed in the plurality of positions.

2. A flat display apparatus according to claim 1, wherein the wiring member has an insulation resin layer, a metal-made wiring pattern formed on the insulation resin layer, and an insulating layer covering the wiring pattern, and the bendable portion is formed by removing a part of the insulation resin layer.

3. A flat display apparatus according to claim 2, wherein the insulation resin layer is formed of a polyimide tape.

4. A flat display apparatus according to claim 1, wherein the bendable portions are formed in at least two positions, namely a portion in the proximity of the first electrode terminal of the wiring member and a portion between the first electrode terminal and the second electrode terminal.

5. A flat display apparatus according to claim 1, wherein the bendable portions are formed in at least three positions, namely a portion in the proximity of the first electrode terminal of the wiring member, a portion in the proximity of the second electrode terminal, and a portion situated between the portion in the proximity of the first electrode terminal and the portion in the proximity of the second electrode.

6. A flat display apparatus according to claim 4, wherein the wiring member further includes a driver integrated circuit placed between the second electrode terminal and the bendable portion formed between the first electrode terminal and the second electrode terminal.

7. A flat display apparatus according to claim 4, wherein the wiring member further includes a driver integrated circuit placed between the first electrode terminal and the bendable portion formed between the first electrode terminal and the second electrode terminal.

8. A flat display apparatus according to claim 1, wherein the flat display panel is either of a plasma display panel or a field emission display panel, and the wiring member is a wiring board having a driver integrated circuit.

9. A flat display apparatus according to claim 1, wherein the flat display panel is a liquid crystal panel and the wiring member is a flexible cable.

* * * * *